(12) United States Patent
Eberhardt et al.

(10) Patent No.: US 9,360,175 B2
(45) Date of Patent: Jun. 7, 2016

(54) DEVICE FOR SUPPLYING ELECTROMAGNETIC RADIATION

(71) Applicant: OSRAM GmbH, Munich (DE)

(72) Inventors: Angela Eberhardt, Augsburg (DE); Christina Wille, Friedberg (DE); Florian Peskoller, Ingolstadt (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 14/383,906

(22) PCT Filed: Jun. 12, 2013

(86) PCT No.: PCT/EP2013/062186
§ 371 (c)(1),
(2) Date: Sep. 9, 2014

(87) PCT Pub. No.: WO2013/189809
PCT Pub. Date: Dec. 27, 2013

(65) Prior Publication Data
US 2015/0092391 A1    Apr. 2, 2015

(30) Foreign Application Priority Data

Jun. 18, 2012 (DE) .......................... 10 2012 210 195

(51) Int. Cl.
*F21K 99/00*       (2010.01)
*H01L 33/50*       (2010.01)
*F21V 14/08*       (2006.01)
*F21V 29/00*       (2015.01)
*G02B 26/00*       (2006.01)

(52) U.S. Cl.
CPC . *F21K 9/56* (2013.01); *F21V 14/08* (2013.01); *F21V 29/2206* (2013.01); *G02B 26/008* (2013.01); *H01L 33/501* (2013.01)

(58) Field of Classification Search
CPC .......... H01L 33/501; F21K 9/56; F21V 14/08; F21V 29/2206
See application file for complete search history.

(56) References Cited

U.S. PATENT DOCUMENTS

| 7,714,335 | B2 | 5/2010 | Beckers |
| 8,772,821 | B2 | 7/2014 | Eberhardt et al. |
| 2005/0027075 | A1 | 2/2005 | Guerin et al. |

(Continued)

FOREIGN PATENT DOCUMENTS

| DE | 102009003936 A1 | 7/2010 |
| DE | 102009016953 A1 | 11/2010 |

(Continued)

OTHER PUBLICATIONS

International Search Report of PCT/EP2013/062186 dated Oct. 9, 2013.

(Continued)

*Primary Examiner* — Thomas M Sember
(74) *Attorney, Agent, or Firm* — Viering, Jentschura & Partner mbB

(57) ABSTRACT

A device for providing electromagnetic radiation may include a radiation arrangement for generating excitation radiation, and at least one conversion element for generating conversion radiation, which includes condensed metal phosphate and phosphors embedded in the condensed metal phosphate, and is arranged at a distance from the radiation arrangement in a beam path of the excitation radiation. The conversion element includes a silicatic matrix and alkali metal phosphate.

15 Claims, 2 Drawing Sheets

(56) References Cited

U.S. PATENT DOCUMENTS

| | | |
|---|---|---|
| 2011/0176305 A1 | 7/2011 | Schallmoser |
| 2012/0300432 A1* | 11/2012 | Matsubayashi ......... F21K 9/135 362/84 |
| 2013/0229787 A1 | 9/2013 | Berben et al. |

FOREIGN PATENT DOCUMENTS

| | | |
|---|---|---|
| DE | 102010028776 A1 | 11/2011 |
| JP | 2008034546 A | 2/2008 |
| WO | 2006054233 A2 | 5/2006 |
| WO | 2010003763 A1 | 1/2010 |
| WO | 2010115415 A2 | 10/2010 |
| WO | 2011138169 A1 | 11/2011 |
| WO | 2012062355 A1 | 5/2012 |

OTHER PUBLICATIONS

German Office Action issued in WO2013/189809A1 dated Apr. 4, 2013.

* cited by examiner

DEVICE FOR SUPPLYING ELECTROMAGNETIC RADIATION

RELATED APPLICATIONS

The present application is a national stage entry according to 35 U.S.C. §371 of PCT application No.: PCT/EP2013/062186 filed on Jun. 12, 2013, which claims priority from German application No.: 10 2012 210 195.0 filed on Jun. 18, 2012, and is incorporated herein by reference in its entirety.

TECHNICAL FIELD

Various embodiments relate to a device for providing electromagnetic radiation. The device includes a radiation arrangement for generating excitation radiation, and at least one conversion element for generating conversion radiation. The conversion element includes phosphors and is arranged at a distance from the radiation arrangement in a beam path of the excitation radiation.

BACKGROUND

Currently, in modern illumination apparatuses, radiation sources which are energy-efficient, have high intensity and/or provide a high luminous power density are being used increasingly, such as high-power LEDs (light-emitting diodes), lasers, for example in the form of laser diodes, and/or superluminescent diodes. Unlike incandescent bulbs, which are thermal radiators, these radiation sources emit light in a narrowly limited spectral range, so that their light is almost monochromatic or exactly monochromatic. A possibility of developing further spectral ranges consists, for example, in radiation conversion, in which phosphors are irradiated by means of LEDs and/or laser diodes and in turn emit light of a different wavelength. In so-called remote phosphor applications, for example, a layer including phosphor located at a distance from a radiation source is conventionally illuminated by means of LEDs or laser diodes and in turn emits radiation of a different wavelength. For example, this technique may be used in order to convert light of blue LEDs by admixture of yellow light which is generated by excitation of a layer containing phosphor, into white light.

Furthermore, currently, projectors (beamers) are regularly used in order to represent data optically. Such a projector projects the data to be represented in the form of individual still and/or moving images, for example onto a canvas. In a conventional projector, it is known to generate the necessary excitation radiation with the aid of a conventional discharge lamp, for example an ultrahigh-pressure mercury vapor discharge lamp. Recently, however, LARP (Laser Activated Remote Phosphor) technology has also been used. In this technology, a conversion element which is arranged at a distance from the radiation source, and which includes phosphor or consists thereof, is irradiated with excitation radiation, in particular an excitation beam (pump beam, pump laser beam). The excitation radiation of the excitation beam is fully or partially absorbed by the phosphor and converted into conversion radiation (emission radiation), wavelengths and therefore spectral properties and/or color of which are determined by the conversion properties of the phosphor. In the case of down-conversion, the excitation radiation of the radiation source is converted by the irradiated phosphor into conversion radiation with wavelengths longer than those of the excitation radiation. For example, blue excitation radiation (blue laser light) can be converted into red or green conversion radiation (conversion light, illumination light) in this way with the aid of the conversion element.

The excitation radiation may introduce a large amount of energy into the conversion element, so that the latter may be heated strongly. This may cause damage to the conversion element and/or the phosphors contained therein, which may be present as a single phosphor or a phosphor mixture. Furthermore, in the event of insufficient cooling of the phosphor, conversion losses occur owing to efficiency reduction due to thermal quenching. In order to avoid excessive heating and therefore avoid the concomitant possible damage to the conversion element or the phosphor, it is known to arrange a plurality of conversion elements on a phosphor wheel (also referred to as a pump wheel or color wheel), which is irradiated with the excitation beam while it rotates. Owing to the rotation, different conversion elements and/or regions of the conversion element are illuminated successively, and the light energy introduced is therefore distributed over the surface.

A degree of miniaturization in LARP has so far been limited technology because of the design, since the arrangement which includes the radiation source (pump laser) and the phosphor wheel requires a great deal of installation space. For various applications, however, a small installation space is desirable, for example in the field of pico-projection, i.e. in the case of small-dimension mobile projectors, and/or miniaturized projection units for so-called embedded projection, in which the projection unit is integrated for example into a cell phone or a camera. Thermal connection of the conversion element is important in this case, in order to avoid overheating and damage.

For remote phosphor applications, thin phosphor layers such as cubic silicate minerals, orthosilicates, garnets or nitrides are applied onto surfaces of corresponding carriers. The phosphor layers are usually fixed mechanically by binders and connected to an optical system (lenses, collimators, etc.), in which case the light coupling may for example take place through air or an immersion medium. In order to ensure the best possible optical connection of the optical system to the phosphor, and in order to avoid light losses, optical connection which is as direct as possible should be ensured. For remote phosphor applications, that is to say applications in which the phosphor and the radiation source, for example high-power laser diodes, are spatially separated, a thin phosphor layer is for example applied onto a surface, for example of a substrate and/or of a carrier, mechanically fixed by binders and connected (air, immersion, etc.) to an optical system (lenses, collimators, etc.).

In the applications mentioned above, the phosphors are conventionally excited to emission by means of LEDs and/or laser diodes with high luminous powers. The heat losses then incurred are to be dissipated, for example via the carrier, in order to avoid overheating and therefore thermally induced changes in the optical properties, or even destruction of the phosphor. The phosphors are, for example, excited to emission by light sources with a high power density (a few $W/mm^2$). The large (Stokes) heat losses then incurred lead to heat input in the phosphor layer. If these temperatures become too high, for example owing to insufficient cooling, thermally induced changes in the optical properties (emission wavelength, conversion efficiency, etc.) may occur, or ultimately destruction of the phosphors for the layer itself. The origin of this degeneration of the phosphor layer may be both the phosphor and the binder. For this reason, the phosphor layer should be configured in such a way that it can be cooled optimally in order to avoid thermal destruction of the phosphors and the binder.

In the absence of additional use of binders, for example silicones, the phosphors, which are usually present in powder form, do not form mechanically stable layers, that is to say abrasion- and/or scratch-resistant layers. Binders, moreover, are also generally used in order to bring the phosphor particles together to form a phase which can then be applied onto corresponding surfaces. When binders are used for layer stabilization, however, these binders themselves may interact with the phosphors and therefore negatively influence their optical and thermal properties, as well as their lifetime. Furthermore, the thermal conductivity of the binder often represents a limiting factor for the dissipation of heat incurred in the conversion element. Furthermore, the binder itself should be thermally and spectrally stable and exhibit little to no ageing properties. For this reason, the use of an inert, optically transparent and thermally and spectrally stable binder is advantageous for the production of stable phosphor layers with long lifetimes.

It is known to use silicones as binder matrices for phototechnological excitation (for example LEDs). These, however, do not allow very high luminous powers (power densities of a few W/mm$^2$) or necessitate further technological outlay (for example color wheels to reduce the action time of the light). The known phosphor/silicone mixtures are usually applied directly on to metal substrates. For example, the phosphor is suspended in organic matrices, for example silicone, and then for example screen printed. The layers are, for example, about 30 μm thick. Silicone has a poor thermal conductivity ($\lambda_{silicone}$=0.1-0.2 W/m·K), the effect of which is that the phosphor is heated more strongly during operation and therefore becomes less efficient. This is problematic particularly in the case of high-power LEDs and in laser applications.

The coating process when forming a phosphor layer is limited by the nature of the substrate materials. For instance, high-temperature processes cannot be envisioned on many plastics and metallic materials (for example aluminum) owing to their melting temperatures or thermal stability. Alternatively available highly thermally conductive ceramic materials (for example AlN), on the other hand, entail increased technological and financial outlay.

Inorganic matrices having improved heat dissipation are known from various documents, for example low-melting glass from WO 2011/104364 A1 or metal phosphates from WO 2011/138169 A1.

Inorganic matrices, however, have the disadvantage compared with organic matrices that relatively high temperatures are generally necessary in order to achieve a compact layer with no bubble content, when a certain chemical stability is required (for example in relation to UV radiation and/or moisture). Typical softening temperatures of common low-melting glasses are from 500° C. to 600° C. At these temperatures, optoelectronic substrates, for example an LED Chip, or highly reflective substrates, for example highly reflective aluminum, or the phosphor to be embedded, in particular nitrides, are already damaged and therefore become less efficient.

As alternatives, conversion elements which are formed from a ceramic including the phosphor or from a crystal including the phosphor are known. In particular, the phosphor may form the ceramic or the crystal. Such conversion elements can be adhesively bonded firmly to heat sinks, so that the heat incurred therein can be dissipated. A limiting factor for the dissipation of the heat is in this case the thermal conductivity of the adhesive used. Furthermore, good heat dissipation is beneficial when the conversion elements are formed particularly thinly.

SUMMARY

In various embodiments, a device for providing electromagnetic radiation is provided, which may be produced straightforwardly and/or economically and/or makes it possible to provide conversion radiation with high-energy excitation radiation. Furthermore, in various embodiments a device for providing electromagnetic radiation is provided, the conversion element of which is stable in respect of temperature and weathering and/or has a high efficiency and/or a long lifetime.

In various embodiments, a device for providing electromagnetic radiation is provided. The device includes a radiation arrangement for generating excitation radiation, and at least one conversion element for generating conversion radiation. The conversion element includes a condensed metal phosphate and phosphors embedded in the condensed metal phosphate. The conversion element is arranged at a predetermined distance from the radiation arrangement in a beam path of the excitation radiation.

The conversion element, and therefore the device, can be produced straightforwardly and/or economically. A condensed metal phosphate makes it possible to use the conversion element for generating conversion radiation with high-energy excitation radiation. In other words, the radiation arrangement may include one, two or more radiation sources which generate the excitation radiation with a high power density. Furthermore, the conversion element including the condensed metal phosphate is particularly stable in respect of temperature and weathering and has a high efficiency and a long lifetime, since, owing to the condensed metal phosphate, improved radiation stability, for example UV stability, and heat dissipation are provided and the embedded phosphor is damage less by environmental factors.

The condensed metal phosphate is a binder for the phosphor, which before the binding by means of the metal phosphate is present for example in powder form, i.e. as a phosphor powder. In other words, the metal phosphate forms a matrix for embedding the phosphor. The phosphor includes a multiplicity of phosphor particles embedded in the matrix. The matrix may be produced from a condensed metal phosphate solution. Compared with a glass matrix, which may for example be produced by means of a process of melting the raw material mixture, production of the matrix from condensed metal phosphate solution makes it possible to embed the phosphor powder at low temperatures, for the same matrix composition. This can contribute to embedding the phosphor noninvasively and/or damaging it less or not at all during the embedding.

The different process temperatures can be seen from a comparison with a glass produced by means of a melting process. In this case, the following process steps are carried out:

producing a mixture of all materials,
glass production by melting the mixture,
rapid cooling of the melt, optionally by fritting and optionally producing a glass powder by grinding.

This glass, or the glass powder, can then be softened by temperature elevation.

In contrast thereto, the sol-gel method involves polymerization, that is to say the compounds (for example metal phosphate) dissolved in liquids, which crosslink and optionally eliminate byproducts during temperature elevation. In the case of elimination of water, this is a condensation of reaction. The temperatures required for the crosslinking are significantly lower than the temperature which is needed for re-softening a glass produced by means of a melt.

The predetermined distance is greater than zero, which means for example that the radiation source and the conversion element have no direct physical contact with one another.

The conversion element may for example include a conversion layer, which may for example be formed from a substrate. With the aid of the metal phosphate, for example, a conversion layer with a particular binding strength may be produced. The conversion layer may furthermore be formed in such a way that it experiences no mechanical damage and/or destruction during subsequent processing steps. Furthermore, the conversion layer can be produced at moderate temperatures. For example, the temperatures may be lowered further by admixture of additives. The conversion element with the condensed metal phosphate may have good chemical and/or optical stability, good thermal conductivity and/or good temperature stability. This permits a good quantum efficiency for the embedded phosphor, since the phosphor powder is not damaged, or is only slightly damaged, during the embedding and/or the phosphor degenerates less during operation owing to the improved heat dissipation. This can contribute to a high efficiency and a long lifetime, particularly when excitation radiation with a high power density is introduced.

In various embodiments, the conversion element is arranged movably relative to the radiation arrangement. For example, the conversion element is arranged rotatably In various embodiments, the device includes a phosphor wheel that is arranged rotatably about an axis and includes the conversion element. The conversion element may, for example, be arranged on an edge of the phosphor wheel and/or on a circular surface of the phosphor wheel. In addition to the conversion element, for example, one, two or more further conversion elements may be arranged. The conversion elements may, for example, include different phosphors.

In various embodiments, the conversion element is arranged fixed relative to the radiation arrangement. For example, the device may be used for a pico-projection application without a phosphor wheel, for example in a portable electronic unit, in which case the use of the condensed metal phosphate as a matrix for the conversion element can contribute to sufficient heat dissipation.

In various embodiments, a surface of the conversion element includes a cooling structure. The cooling structure has an artificially increased surface area of the conversion element. This can contribute to good cooling of the conversion element.

In various embodiments, the cooling structure includes ribs and/or lamellae. This may contribute to forming the cooling structure effectively in a straightforward way In various embodiments, the condensed metal phosphate is amorphous, or predominantly amorphous. The fact that the metal phosphate is amorphous, or predominantly amorphous, may for example mean that the matrix itself has no, or at most 25 vol %, for example at most 10 vol %, crystalline phase fractions. The embedded crystalline phosphor is not included in this.

In various embodiments, the condensed metal phosphate is colorless.

In various embodiments, the condensed metal phosphate is transparent for the conversion radiation and/or the excitation radiation.

In various embodiments, the condensed metal phosphate includes aluminum phosphate, which is formed for example by condensation from monoaluminum phosphate. This can contribute to oxidation-sensitive phosphors, for example nitrides, having no efficiency loss, or only a small efficiency loss, after embedding in such matrices, for example at temperatures of at most 350° C. Moisture tests have revealed that these matrices react at least substantially neutrally and therefore have good binding and/or chemical resistance.

In various embodiments, the conversion element also includes water glass as a starting material. This can contribute to embedding the phosphor powder at low temperatures and, at the same time, increasing the chemical stability in comparison with a pure water glass matrix. As a starting material for the matrix, the waterglass may for example be present as an inorganic sol-gel. The water glass may, for example, include alkali metal silicates or consist thereof.

In various embodiments, the conversion element includes zinc compounds, magnesium compounds and/or boron compounds. This can contribute to reducing the temperature required for a binding reaction during the production process of the conversion element, in particular the phosphor layer, when these elements are contained in the binder as oxides and/or as phosphates in the solution for producing the conversion layer, or the phosphor layer, i.e. in addition to the metal phosphate in the binder. For example, the temperatures may be reduced to a range of between 200° C. and 300° C.

In various embodiments, the radiation arrangement includes at least one radiation source, which generates the excitation radiation with a high luminous density.

In various embodiments, the radiation source is a laser, a laser diode or a superluminescent diode.

In various embodiments, the high luminous density lies between 1 $W/mm^2$ and 50 $W/mm^2$.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the appended drawings, which form a part of this description and in which specific embodiments, in which the disclosure can be implemented, are shown for illustration. In this regard, direction terminology such as "up", "down", "forward", "backward", "front", "rear", etc. is used with reference to the orientation of the figure or figures being described. Since components of embodiments can be positioned in a number of different orientations, the direction terminology is used only for illustration and is in no way restrictive. It is understood that other embodiments may be used and structural or logical modifications may be carried out, without departing from the protective scope of the present disclosure. It is to be understood that the features of the various embodiments described herein may be combined with one another, unless specifically indicated otherwise. The following detailed description is therefore not to be interpreted in a restrictive sense, and the protective scope of the present disclosure is defined by the appended claims.

In the scope of this description, terms such as "connected" or "coupled" are used to describe both direct and indirect connection, and direct or indirect coupling. In the figures, elements which are identical or similar are provided with identical references, insofar as this is expedient.

In various embodiments, a component emitting electromagnetic radiation may be a semiconductor component emitting electromagnetic radiation and/or may be formed as a diode emitting electromagnetic radiation, as an organic diode emitting electromagnetic radiation, as a transistor emitting electromagnetic radiation or as an organic transistor emitting electromagnetic radiation. The electromagnetic radiation may for example be light in the visible range, UV light and/or infrared light. In this context, the component emitting electromagnetic radiation may, for example, be formed as a light-emitting diode (LED), as an organic light-emitting diode (OLED), as a light-emitting transistor or as an organic light-emitting transistor. In various embodiments, the light-emitting component may be part of an integrated circuit. Furthermore, a multiplicity of light-emitting components may be provided, for example accommodated in a common housing.

Figure 1:
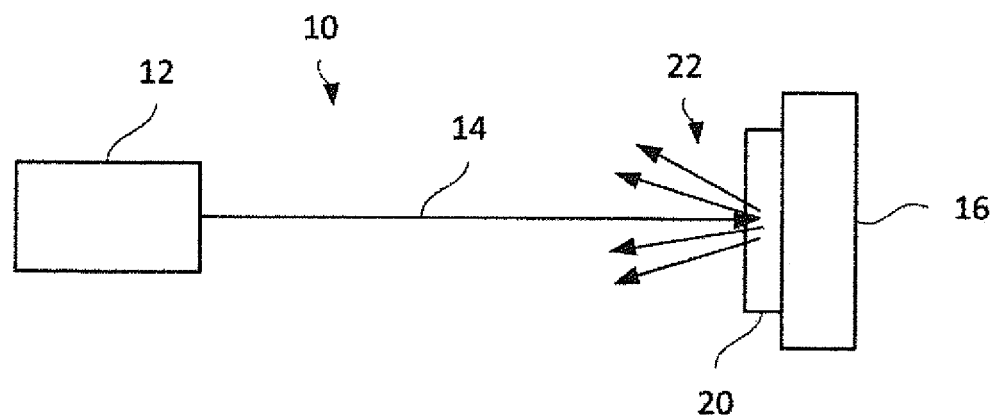
FIG. 1 shows an embodiment of a device for providing electromagnetic radiation.

FIG. 1 shows a device 10 for providing electromagnetic radiation according to various embodiments. The device 10 includes a radiation arrangement 12, which generates excitation radiation. The radiation arrangement 12 is, for example, a radiation source or includes one, two or more radiation sources. For example, a component emitting electromagnetic radiation is used as the radiation source. The radiation source 12 may, for example, be a laser radiation source. The laser radiation source may, for example, be a laser diode. The laser diode may be a single-mode or multimode laser diode. For example, the laser diode may be a laser diode emitting blue laser light, also referred to as a blue laser diode. A power of the radiation source 12 may, for example, be from 50 mW to 5 W. As an alternative to a blue laser diode, the emission wavelengths of which may for example lie in the spectral range of from 400 nm to 480 nm, a UV (laser) radiation source may be used as the radiation source 12, for example with an emission wavelength of between 300 nm and 400 nm.

The excitation radiation 14 is, for example, electromagnetic radiation in the visible range. The excitation radiation (pump light or pump radiation) 14 may for example also be ultraviolet radiation, infrared radiation or even corpuscular radiation, for example an electron beam or ion beam, although the excitation radiation 14 is preferably laser radiation and/or LED light. The excitation radiation 14 is not necessarily limited to a particular spectral range; for example, pumping may be carried out in the red, green, blue and/or ultraviolet spectral range, for instance using a corresponding radiation source (pump radiation source) or a combination of a plurality of radiation sources in the radiation arrangement 12. In general, the radiation sources may be configured in order to be operated with, for example, an essentially constant power or, alternatively, in pulsed mode.

The excitation radiation 14 is directed onto a conversion element 20 fastened on a carrier 16. In other words, the radiation arrangement 12 illuminates or irradiates the conversion element 20 and/or the conversion element 20 is arranged in a beam path of the excitation radiation 14. The carrier 16 may also be referred to as a substrate. Furthermore, the conversion element 20 may be applied on a substrate which can then be fastened on the carrier 16. The radiation arrangement 12 has a predetermined distance, which is greater than zero, from the conversion element 20, and is therefore not in direct physical contact with the conversion element 20. The carrier 16 may for example be part of a color wheel, and/or for example a part of a projector. The device 10 may, for example, be arranged in the projector. As an alternative thereto, the device 10 may for example be arranged in a motor vehicle, for example as interior lighting, a headlamp or taillamp, in a portable electronic unit, for example a portable projector and/or a cell phone, or in an endoscope. Furthermore, the carrier 16 may include a cooling device.

The irradiated conversion element 20 in turn emits conversion radiation 22. As an alternative, the device 10 may include a plurality of radiation arrangements 12 and/or a plurality of conversion elements 20. The excitation radiation 14 and/or the conversion radiation 22 may also be referred to as electromagnetic radiation. In order to generate the conversion radiation 22, the conversion element 20 includes one or more phosphors. The phosphors are energetically excited with the aid of the directed excitation beam 14. During the subsequent energetic decay, the phosphors emit the conversion radiation with one or more predetermined wavelengths. Conversion of the excitation radiation 14 therefore takes place, so that the conversion radiation 22 is generated. During the conversion, the wavelengths of the excitation radiation 14 are shifted to shorter or longer wavelengths. The colors may be individual colors or mixed colors. The individual colors may for example include green, red or yellow light, and/or the mixed colors may for example be mixed from green, red and/or yellow light and/or include, for example, white light. In addition, blue light may be provided, for example by the conversion element 20 being formed in such a way that at least partially unconverted excitation radiation 14 leaves the device 10 as usable electromagnetic radiation. The individual or mixed colors may be represented with the aid of the conversion radiation 22 and/or the excitation radiation 14. For example, green, red and yellow may be represented with the aid of blue laser light. When using UV laser light as pump light, the phosphors may also be selected in such a way that they represent red, green, blue and yellow.

The conversion element 20 includes a matrix material (binder), which includes a condensed metal phosphate. The phosphor or phosphors are embedded in the matrix material. A phosphor may be material understood as a material which with losses converts electromagnetic radiation of one wavelength into electromagnetic radiation of another (longer) wavelength, for example by means of phosphorescence or fluorescence. The energy difference between absorbed electromagnetic radiation and emitted electromagnetic radiation may be converted into phonons, i.e. heat, and/or by means of emission of electromagnetic radiation with a wavelength proportional to the energy difference.

Conventional phosphors are for example garnets or nitrides, silicates, oxides, phosphates, borates, oxynitrides, sulfides, selenides aluminates, tungstates, and halides of aluminum, silicon, magnesium, calcium, barium, strontium, zinc, cadmium, manganese, indium, tungsten and other transition metals, or rare earth metals such as yttrium, gadolinium or lanthanum, which are doped with an activator, for example copper, silver, aluminum, manganese, zinc, tin, lead, cerium, terbium, titanium, antimony or europium. In various embodiments of the disclosure, the phosphor is an oxidic or (oxy) nitridic phosphor, such as a garnet, orthosilicate, nitrido(alumo)silicate, nitride or nitrido-orthosilicate, or a halide or halophosphate. Specific examples of suitable phosphors are strontium chloroapatite:Eu (($Sr,Ca)_5(PO_4)_3Cl:Eu$; SCAP), yttrium aluminum garnet:cerium (YAG:Ce), $CaAlSiN_3$:Eu or green-emitting garnet $A_3B_5O_{12}$:Eu, where A is preferably Y, Lu alone or in combination, and B is preferably Al or Ga alone or in combination. Furthermore, for example, particles with light-scattering properties and/or auxiliaries may be contained in the phosphor or phosphor mixture. Examples of temporary auxiliaries include surfactants and organic solvents. Examples of permanent additives are light-scattering particles, for example metal oxide particles or stabilizers, for example oxidic nanoparticles.

The matrix material includes a condensed metal phosphate, for example a condensed aluminum phosphate, from for example a monoaluminum phosphate solution. The matrix material is for example amorphous, or predominantly amorphous, colorless and/or transparent for the excitation radiation 14 and/or the conversion radiation 22. The condensed metal phosphate has a good thermal conductivity, which is higher than that of silicone, and good UV stability. The condensed metal phosphate is for example free of lead or low in lead, for example with a content of less than 1 mol %. The condensed metal phosphate is generally low in alkali metals and/or halogens, and is for example free of alkali metals or halogens. The concentrations of alkali metals and halogens may therefore be negligible and/or respectively lie below 1 mol %. This means, for example, that these elements are not deliberately added and are due at most to impurities of the precursor materials used. In this way, higher moisture stability is achieved. One exception is the combination of metal phosphate with alkali metal silicate.

The thermal expansion coefficient of the conversion layer with the metal phosphate matrix and with the phosphor and/or optionally with additives may, for example, be greater than $5.0 \times 10^{-6}\,K^{-1}$.

The condensed metal phosphate may include phosphate as its main component, which may be present in various modifications, that is to say as polyphosphate, metaphosphate, orthophosphate and in all possible intermediate stages. The term phosphates also includes, for example, monophosphate such as the water-soluble $Al(H_2PO_4)_3$ and water-insoluble polyphosphate such as $[Al(PO_3)_3]_n$. Depending on the processing, metaphosphate such as $(Al(PO_3)_3)$ or tertiary phosphate such as $AlPO_4$ may be formed. One guideline is a molar ratio of phosphor to aluminum P/Al of from 1 to 10 as limit values.

Additives, and/or components modifying the refractive index, may be added to the metal phosphate. These components are for example inorganic. The metal phosphate may for example be aluminum phosphate, yttrium phosphate, alkaline earth metal phosphate, phosphates of main group III and the subgroups, or other rare earth phosphates, or alternatively mixtures thereof. Additives such as $SiO_2$, for example in the form of Aerosil, fumed $Al_2O_3$, or $TiO_2$, etc., may in particular also be added to the phosphate. For example, these additives are added as nanopowders, their average particle size lying for example in the range of from 1 nm to 40 nm. Ground glasses, for example hard glasses, or ground glass solder may also be added as nanopowders. These additives may increase the thermal conductivity of the conversion element 20, act as a reflector, and/or also adapt the thermal expansion coefficient.

Further optional components may be used to modify the refractive index, in particular tellurium or bismuth compounds. The condensed metal phosphate is moisture-resistant, and may for example be produced at low temperatures. The proportion of powders added (phosphor and optionally additives) may be so high that the condensed metal phosphate predominantly binds the particles to one another. Some or all of the components added may be selected in such a way that they react chemically with the metal phosphate and thereby modify it. The metal phosphate is suitable for embedding phosphor powders, i.e. as a matrix for the conversion element 20.

Use of the condensed metal phosphate contributes to a high efficiency and a long lifetime of the conversion element 20. For example, high UV stability, high thermal conductivity, good thermal stability and/or a high refractive index are achieved.

The production of such metal phosphates is carried out, for example, by means of the known sol-gel method from a soluble metal phosphate, or from the reaction product of a metal hydroxide with phosphoric acid, or from the reaction product of metal salt with phosphoric acid. The solvent is initially removed by drying. By a subsequent treatment at elevated temperatures, water or components containing carbon are eliminated and the metal phosphate is then in polymerized form.

For example, aluminum phosphate, yttrium phosphate or another rare earth phosphate is used, because such phosphates have high temperature stability and good moisture stability. For the embedding of phosphor, it is important that the latter is not damaged by a chemical reaction with the solution or resulting reaction products, or by excessively high temperatures. The condensed metal phosphate may be present in amorphous, semicrystalline or crystalline form.

For example, a matrix of aluminum phosphate may be formed by condensation at elevated temperature from a monoaluminum phosphate solution. For example, oxidation-sensitive phosphors, for example nitrides, exhibit no significant efficiency loss after embedding in such a matrix at temperatures of between 100° C. and 400° C., for example between 200° C. and 350° C. Moisture tests of such conversion elements 20 have revealed that these matrices react neutrally and therefore indicate good binding and chemical resistance. The temperature required for the binding reaction may be reduced further when other glass-forming metal phosphates, for example of Zn, Mg, B, or oxides thereof, are contained in the solution. In principle, such a matrix is suitable for substrates such as for example glass, ceramic or various metals.

For example, phosphor, for example YAG:Ce or another phosphor, may be suspended in powder form in an aqueous solution of the metal phosphate and then applied as a layer onto the substrate. The drying may subsequently be carried out at low temperatures, for example between 80° C. and 150° C., and/or under reduced ambient pressure. This can lead to curing by condensation, for example at a curing temperature which is limited for example by the thermal stability of the constituent components. For example, the baking is carried out at temperatures of between 180° C. and 500° C., for example between 200° C. and 350° C. The phosphor solids content may be varied depending on the color locus to be obtained for the electromagnetic radiation to be provided with the aid of the device 10. In this case, it is also possible to produce the conversion element 20 in such a way that the excitation radiation 14 is fully converted into conversion radiation 22, apart from thermal losses. To this end, for example, the phosphor solids content may be selected to be so high that the metal phosphate used only encloses the phosphor particles with a thin layer and thereby binds them together. Furthermore, it is possible to embed a mixture of different phosphor powders in the metal phosphate in order to adjust different light colors.

Figure 2:
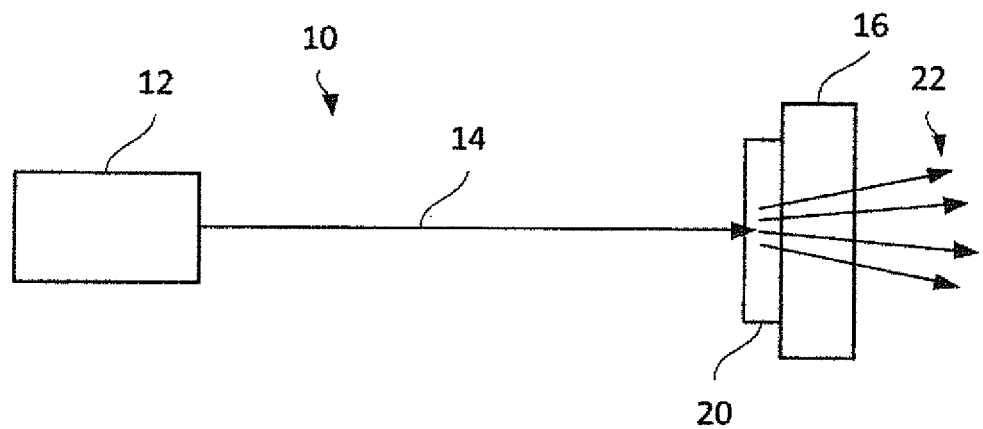
FIG. 2 shows an embodiment of a device for providing electromagnetic radiation.

FIG. 2 shows an embodiment of the device 10 which corresponds substantially to the embodiment shown in FIG. 1, although in contrast thereto, in the embodiment of the device 10 as shown in FIG. 2, the carrier 16 is formed to be at least partially transparent for the conversion radiation 22 and/or the excitation radiation 14.

Figure 3:
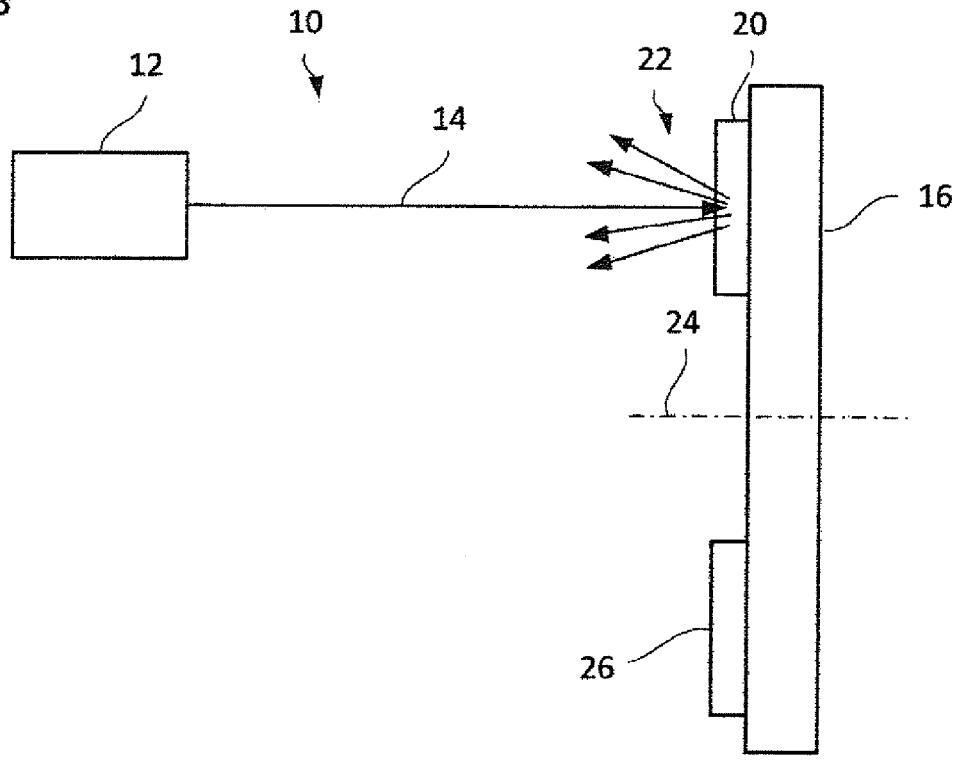
FIG. 3 shows an embodiment of a device for providing electromagnetic radiation.

FIG. 3 shows an embodiment of the device 10 which corresponds substantially to the embodiment shown in FIG. 1, although in contrast thereto, in the embodiment of the device 10 as shown in FIG. 3, the carrier 16 is formed as a phosphor wheel. The phosphor wheel is mounted rotatably about an axis 24. The phosphor wheel can be rotated about the axis 24 with the aid of a drive unit (not represented). Optionally, a further conversion element 26 is arranged on the phosphor wheel. Furthermore, other conversion elements may also be arranged on the phosphor wheel. The conversion elements 20, 26 may include the same and/or different phosphors, so that conversion radiation 22 with the same wavelength or different wavelengths can be generated with the aid thereof.

Figure 4:
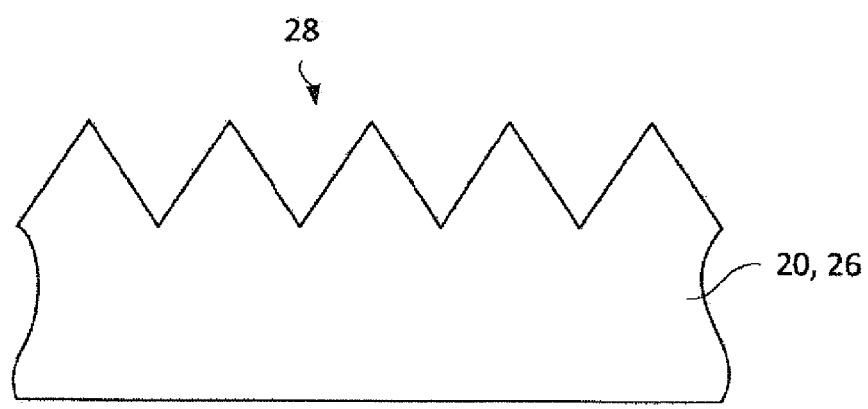
FIG. 4 shows an embodiment of a surface structure of a conversion element.

FIG. 4 shows an embodiment of a surface structure which, for example, may include at least one of the conversion elements 20, 26. For example, the surface structure may be a cooling structure, by which the surface area of the corresponding conversion element 20, 26 is increased. The surface structure is, for example, formed on a side of the corresponding conversion element 20, 26 facing away from the substrate. For example, the surface structure and/or the cooling structure includes ribs 28.

Figure 5:
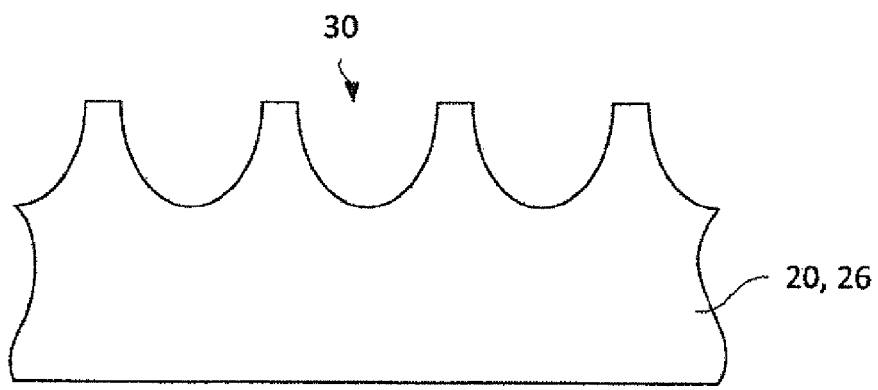
FIG. 5 shows an embodiment of a surface structure of a conversion element.

FIG. 5 shows an embodiment of the surface structure, which, for example, may include at least one of the conversion elements 20, 26. For example, the surface structure may be the cooling structure by which the surface area of the corresponding conversion element 20, 26 is increased. The surface structure is, for example, formed on a side of the corresponding conversion element 20, 26 facing away from the substrate. For example, the surface structure and/or the cooling structure includes lamellae 30.

As an alternative thereto, the corresponding conversion element 20, 26 may also not include a deliberately predetermined surface structure and/or not include a cooling structure.

A method for producing such a conversion element 20 may, for example, include the following steps:
- production or procurement of the monoaluminum phosphate solution;
- production of a suspension of phosphor powder (one or more types) and monoaluminum phosphate solution, optional addition of scattering particles and/or surfactants;
- optional addition of nanopowders for viscosity adjustment and/or stabilization of the suspension;
- optional pretreatment of the substrate in order to improve the wetting and/or layer binding, for example with UV radiation or plasma;
- application of the coating onto the substrate by a known method, for example: screen or template printing, inkjet printing, spin coating, spraying, immersion, slurrying and/or dispensing;
- drying of the layer: for example moderate drying, for example in order to avoid foaming of the layer, in which case temperatures during the drying may be selected depending on the solvent, the drying time and/or the layer volume; in the case of water as a solvent, the drying may for example be carried out at from 30° C. to 80° C.; the drying may for example be carried out by convection, for example in a drying cabinet, or in a microwave oven;
- curing of the layer by condensation: for example at from 150° C. to 500° C., for example at from 200° C. to 350° C., for example for amorphous or predominantly amorphous layers; the curing time may, for example, be selected as a function of the layer volume and may, for example, be in the range of from a few seconds to a one hour, in which case the curing may for example be carried out in an oxidizing atmosphere; for wet layer thicknesses in the range of 50 μm, even 15 minutes may for example be sufficient;
- optionally, after the curing, it may be possible to carry out controlled structuring of the layer and/or to introduce the surface structure.

A particle size distribution for the phosphor powder may for example be a $D_{50}$ of from 5 μm to 50 μm, for example from 5 μm to 30 μm. The mixing ratio of solution to solid may be selected as a function of the particle size. For example, increasingly more matrix solution may be used with a decreasing particle size. For example, for garnet phosphors having a particle size distribution $D_{50}$ of between 5 μm and 30 μm, a phosphor to matrix solution mixing ratio of from 1:0.5 to 1:3 may be selected, expressed in terms of the proportion by weight. The conversion element 20, 26 produced in this way may be used for full or partial conversion. The molar ratio of Al to P may for example, lie in the range of from 1:1 to 1:5. The proportion of additives may be so high that the matrix acts almost only as a binder, i.e. it only bonds the particles to one another. In this case, it is also possible to carry out coating of the substrate with powder, which is then for example fixed by spraying of the matrix solution and subsequent heat treatment (drying, curing).

When the conversion element 20, 26 is used for a laser application (LARP, ITOS, automotive), a suspension of garnet phosphor and monoaluminum phosphate solution may, for example, be applied by doctor blading onto a highly reflective masked substrate (for example aluminum, as used for example in a light application). Before this, the substrate may optionally be irradiated with UV radiation for better wetting. The wet layer thickness may, for example, lie in the range of between 50 μm and 100 μm. Subsequently, for example, partial drying may be carried out at room temperature and then drying at 80° C. for, for example, 12 hours. The dried layer may then be heated at 10° C./min to 350° C., for example, and the temperature may then for example be maintained for from a few seconds to one hour, for example 15 minutes. Depending on the masking, this masking may be removed immediately after the doctor blading or after the partial drying. The heat treatment may, for example, be carried out in an oxidizing atmosphere. The mixing ratio of phosphor to matrix solution may be 1:1, expressed in terms of weight. The cured layer thickness may lie in the range of from 40 μm to 80 μm. These layer thicknesses are suitable, for example, for ITOS applications. In the case of LARP applications, cured layer thicknesses of from 10 μm to 200 μm may be used, to which end lower or higher wet layer thicknesses are correspondingly produced.

When the conversion element 20, 26 is arranged on a glass substrate, for example for a remote phosphor application, a suspension of a nitridic phosphor in powder form and an aqueous monoaluminum phosphate solution, which may in addition also contain other phosphates or oxides, for example Mg and/or Zn and/or B, may be applied onto a glass substrate, for example by doctor blading. The substrate may optionally be irradiated with UV radiation beforehand for better wetting. The wet layer thickness may, for example, lie in the range of between 10 μm and 50 μm. Partial drying may subsequently be carried out, for example at room temperature, and then drying at for example 80° C. for, for example, 12 hours. The dried layer may then, for example, be heated at 10° C./min to 220° C. and the temperature may then for example be maintained for from a few seconds to one hour, for example 15 minutes. Depending on the masking, this masking may be removed immediately after the doctor blading or after the partial drying. The heat treatment may, for example, be carried out in an oxidizing atmosphere. The mixing ratio of phosphor to matrix solution may be 1:1, expressed in terms of weight. The cured layer thickness may lie in the range of from 40 μm to 80 μm. The embedded phosphor may, for example, have a quantum efficiency in the range of the original phosphor powder.

When the conversion element 20, 26 is arranged on a ceramic substrate, for example for a remote phosphor application, the substrate may for example be coated with a phosphor powder or a phosphor powder mixture. The dry phosphor layer may, for example, be sprayed with a monoaluminum phosphate solution, so that the phosphor powder is thereby moistened and can be fixed in a subsequent heating step.

The advantage of the described inorganic matrices including a condensed metal phosphate is that the phosphor can be embedded at moderate temperatures without sizeable damage. These matrices are chemically more stable compared with a pure waterglass matrix, and have better thermal conduction than organic matrices. This is important in particular for high-load laser and LED applications. In the case of a phosphor wheel for a LARP application, it is thereby possible to operate the phosphor wheel with a low speed or to use a less elaborate geometry of the conversion element 20, 26, for example without a cooling structure. It is also conceivable to save on phosphor by reducing the diameter of the phosphor wheel compared with a conventional phosphor wheel. This can also contribute to progressive minaturization of the device 10. For all applications, particularly high power densities are possible. The matrix may, for example, be formed by condensation starting from a monoaluminum phosphate solution. The solutions are economical and can be stored well.

Metal phosphates, for example aluminum phosphate, for example monoaluminum phosphate or aluminum metaphosphate or polymeric aluminum phosphate and/or optional additives in the form of oxide, phosphate and/or salt may for example also be added to waterglass, which can for example contribute to good weathering resistance of the waterglass and of the conversion element 20 formed therefrom. The phosphate may then function as a curer and may thereby contribute to defined curing and, owing to ion exchange, to good chemical stability for the same curing temperature. The aluminum phosphate and/or additives may then, for example, be present in powder form. This will be mixed as homogeneously as possible with the phosphor powder before the liquid alkali metal silicate, for example sodium waterglass, is added. The mixing ratio is dependent on the module and the type of waterglass as well as on the curer composition and curer function. Mixing ratios of curer to liquid alkali metal silicate are, for example, from 1:3 to 1:8 parts by weight.

The pot lives are often longer than with pure waterglass (liquid alkali metal silicate) since the aluminum phosphate solution does not react with the atmosphere, as for example in the case of waterglass (binding with $CO_2$ from the air). Consequently, the curing and setting also take place in a more defined way, since the alkali metal ion from the alkali metal silicate is exchanged with the metal ion of the metal phosphate, and the curing and therefore takes place uniformly and simultaneously throughout the volume. That is to say, a polysilica gel is formed, the crosslinking of which is assisted by the ions contained in the metal phosphate. In the case of aluminum phosphate, this is exchange of the alkali metal ion from the waterglass for the aluminum ion from the curer. The latter is thereby incorporated into the silicatic matrix. Furthermore, alkali metal phosphate is also formed as a filler. By a heat treatment at 300° C., for example, the exchange can be further increased, or completed, so that the weathering resistance is further improved.

The mixing with waterglass may, for example, be carried out according to a method having the following steps:
   mixing the metal phosphate powder with the phosphor powder, and optionally additives;
   producing a suspension of the powder mixture and a waterglass solution;
   applying the suspension containing at least one solid phosphor and at least one alkali metal silicate and at least one metal phosphate onto a substrate surface or into a mold, in order to produce a phosphor layer or a phosphor body;
   curing the phosphor layer or the phosphor body.

As an alternative, alkali metal silicate in powder form may also be used. In this case, it will be added to the powder mixture and the powder mixture will be dissolved or suspended in water.

The ratio of the volumes of alkali waterglass content, metal phosphate, water and solid powder has a direct influence on the homogeneity of the suspension (processability), the viscosity, the resulting layer thickness, the cracking susceptibility, the drying behavior and the optical properties of the resulting layer (subsequent glass content). The volume concentration ratio of liquid alkali metal silicate, including the metal phosphate, and water may in such mixtures be from approximately 1:5 to approximately 5:1, for example from approximately 1:3 to 3:1. For example, the volume concentration ratio of liquid alkali metal silicate(s), including metal phosphate(s) and water, is 1:3, 1:2, 1:1, 2:1 or 3:1. The ratio used may be selected as a function of the target properties of the colorant layer (for example glass content, layer thickness, strength) and the phosphors themselves. In this context, "approximately" means, for example, that the corresponding numerical value may deviate by for instance 10% up or down.

The alkali metal silicate used may, for example, be sodium silicate or potassium silicate. Mixtures of the aforementioned alkali metal silicates are likewise included. The alkali metal silicates are compounds of the general formula $M_2O_x nSiO_2$, where M is an alkali metal and n lies in the range of from 1 to 4. In various embodiments, the alkali metal silicates are used as colloidal, alkaline solutions in water, in particular sodium/potassium silicate solutions. Such aqueous solutions can be produced by dissolving the solid alkali metal silicates in water at elevated temperature and elevated pressure.

In various embodiments, the mass ratio of phosphor or phosphor mixture to the aqueous liquid alkali metal silicate, i.e. the mixture of alkali metal silicate and water, is from approximately 1:5 to approximately 5:1, for example from approximately 1:3 to 3:1. Exemplary concentration ratios are 3:1, 2:1, 1:1, 1:2 or 1:3. These concentration ratios may be processable favorably with a view to the homogeneity of the suspension, sedimentation time and layer thickness. The proportion of metal phosphate required is determined by the amount of alkali silicate and is added to the liquid content, since it dissolves and reacts. The suspension may furthermore contain other constituents, for example particles with light-scattering properties and/or auxiliaries. Examples of auxiliaries include surfactants and organic solvents. The application of the suspension onto a surface of the substrate or the introduction into a mold may be carried out by slurrying, printing, spraying or injection. In order to produce a phosphor layer, the application may furthermore involve spin coating and/or an ultrasound treatment.

The substrate, on to which the phosphor layer is applied, may for example be the carrier 16, the phosphor wheel, a heat sink or an optical component, for example a collimator. The substrate may consist of various suitable materials, for example plastic, glass, ceramic or metal. Molds made of said materials may be used in order to form a phosphor body. The phosphor body may, for example, be a phosphor film. The phosphor layer, the phosphor film and/or the phosphor body, for example a phosphor platelet, may then form the conversion element 20 or be a part of the conversion element 20.

The curing of the phosphor layer or the phosphor body may be carried out by drying and chemical reactions (for example binding by ion exchange, crosslinking, condensation). The curing or drying may be carried out at room temperature or elevated temperature, for example at from 80° C. to 500° C. Various curing/drying steps at different temperature may also be combined with one another. In one embodiment, a drying step at room temperature may be followed by a further drying step at elevated temperature, for example from 80 to 150° C. The curing/drying at elevated temperature may, for example, be carried out in an oven. As an alternative, the substrate or the mold and/or the phosphor layer/phosphor body may be heated by means of microwaves or induction techniques. During the production of a phosphor body, this may be released from the mold after a first drying step and then dried further, optionally at elevated temperature.

With the method for binding by using alkali metal silicates with metal phosphate, very hard, mechanically stable phosphor layers can be produced, the binder of which, in the case of many phosphors, does not interact with the phosphors in the range of their working temperature and is optically transparent and spectrally and thermally stable. It is therefore possible to manufacture both thin phosphor layers with layer thicknesses of between 10 µm and 200 µm on substrate surfaces and unbound phosphor platelets or three-dimensional bodies (optical components) of sizeable extent (a few mm).

In order to make the conversion of the excitation radiation 14 into conversion radiation 20 efficient in one or more of the embodiments explained above, the scattered light fraction of the excitation light 14 may be minimized. This may, for example, be done by light coupling to relatively large phosphor particles. In principle, the particle sizes of the phosphors may be adjusted and selected in a certain range by corresponding processing operations (grinding). In practice, however, there are always distributions of the particle size. Within suspensions, the larger and heavier particles sediment first, and the smaller and lighter ones later, so that after a certain time (inter alia depending on the viscosity of the fluid and the particle sizes) a particle size distribution driven by the force of gravity is formed (small particles on the upper layer surface, larger particles below). The aqueous alkali metal silicate solution, including metal phosphate, may for example be used so that a particle size distribution is formed during the application and curing. The phosphor layer with the phosphor particles may then be separated from the carrier medium after drying and heating, rotated through 180°, and reapplied onto a substrate with the optically more favorable coarser particle distribution upward, for example by bonding with alkali metal silicate with metal phosphate or pure metal phosphate.

As an alternative, the particle distribution may be influenced by an ultrasound treatment. In this case, for example, coarser phosphor particles may be shaken onto the layer surface by means of ultrasound.

The present disclosure is not restricted to the embodiments indicated. For example, the embodiments indicated may be combined. For example, the conversion element 20 may or may not include the cooling structure in any of the embodiments.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced

The invention claimed is:

1. A device for providing electromagnetic radiation, comprising:
   a radiation arrangement for generating excitation radiation, and
   at least one conversion element for generating conversion radiation, which comprises condensed metal phosphate and phosphors embedded in the condensed metal phosphate, and is arranged at a distance from the radiation arrangement in a beam path of the excitation radiation,
   wherein the conversion element comprises a silicatic matrix and alkali metal phosphate.

2. The device as claimed in claim 1, wherein the conversion element is arranged movably relative to the radiation arrangement.

3. The device as claimed in claim 2, which comprises a phosphor wheel that is arranged rotatably about an axis and comprises the conversion element.

4. The device as claimed in claim 1, wherein the conversion element is arranged fixed relative to the radiation arrangement.

5. The device as claimed in claim 1, wherein a surface of the conversion element comprises a cooling structure.

6. The device as claimed in claim 5, wherein the cooling structure comprises ribs and/or lamellae.

7. The device as claimed in claim 1, wherein the condensed metal phosphate is amorphous.

8. The device as claimed in claim 1, wherein the condensed metal phosphate is colorless.

9. The device as claimed in claim 1 wherein the condensed metal phosphate is transparent for the conversion radiation and/or the excitation radiation.

10. The device as claimed in claim 1, wherein the condensed metal phosphate comprises aluminum phosphate, which is formed by condensation from monoaluminum phosphate.

11. The device as claimed in claim 1, wherein the conversion element comprises zinc compounds, magnesium compounds and/or boron compounds.

12. The device as claimed in claim 1, wherein the radiation arrangement comprises at least one radiation source, which generates the excitation radiation with a high luminous density.

13. The device as claimed in claim 12, wherein the radiation source is a laser, a laser diode or a superluminescent diode.

14. The device as claimed in claim 12, wherein the high luminous density lies between 1 W/mm$^2$ and 50 W/mm$^2$.

15. The device as claimed in claim 13, wherein the high luminous density lies between 1 W/mm$^2$ and 50 W/mm$^2$.

* * * * *